US012628494B2

(12) United States Patent
Won et al.

(10) Patent No.: US 12,628,494 B2
(45) Date of Patent: May 12, 2026

(54) SEMICONDUCTOR NANOPARTICLE WITH HIGH LEVEL OF CIRCULARITY AND ELECTROLUMINESCENT DEVICE INCLUDING SAME

(71) Applicant: Samsung Electronics Co., Ltd., Suwon-si (KR)

(72) Inventors: Yuho Won, Seoul (KR); Sung Woo Kim, Hwaseong-si (KR); Eun Joo Jang, Suwon-si (KR); Hyo Sook Jang, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 920 days.

(21) Appl. No.: 17/895,253

(22) Filed: Aug. 25, 2022

(65) Prior Publication Data

US 2023/0074734 A1     Mar. 9, 2023

(30) Foreign Application Priority Data

Aug. 26, 2021    (KR) ........................ 10-2021-0113263

(51) Int. Cl.
    *H10K 50/115*       (2023.01)
    *B82Y 40/00*       (2011.01)
         (Continued)

(52) U.S. Cl.
    CPC ............ *H10K 50/115* (2023.02); *B82Y 40/00* (2013.01); *H10K 71/00* (2023.02); *H10K 85/381* (2023.02);
         (Continued)

(58) Field of Classification Search
    CPC .... H10K 50/115; H10K 71/00; H10K 85/381; H10K 2102/00; H10K 2102/351;
         (Continued)

(56) References Cited

U.S. PATENT DOCUMENTS 6,366,016 B1 * 4/2002 Sakaguchi ............. H10K 71/00
                                     428/917
10,954,440 B2    3/2021   Won et al.
             (Continued)

FOREIGN PATENT DOCUMENTS

| KR | 20200122719 A | 10/2020 |
| KR | 20210027211 A | 3/2021 |
| KR | 20210045948 A | 4/2021 |

OTHER PUBLICATIONS

Botao Ji et al., "ZnSe/ZnS Core/Shell Quantum Dots with Superior Optical Properties through Thermodynamic Shell Growth," Nano Lett., Mar. 5, 2020, pp. 2387-2395, vol. 20.
            (Continued)

*Primary Examiner* — Caleb E Henry
(74) *Attorney, Agent, or Firm* — CANTOR COLBURN LLP

(57) ABSTRACT

An electroluminescent device includes a first electrode; a second electrode spaced apart from the first electrode; and a light emitting layer disposed between the first electrode and the second electrode, the light emitting layer includes semiconductor nanoparticles, wherein the semiconductor nanoparticles do not include cadmium, the semiconductor nanoparticles have a core shell structure, the semiconductor nanoparticles include zinc, selenium, tellurium, and sulfur, wherein in a two dimensional image obtained by an electron microscopy analysis, the semiconductor nanoparticles show an average value of a circularity defined by the following equation of greater than or equal to about 0.8 and less than or equal to about 1:

(Continued)

$$circularity = 4\pi \times \frac{Area}{[Perimeter]^2}$$

wherein Area is an area of a two dimensional image of an individual semiconductor nanoparticle, and Perimeter is a circumference of the two dimensional image of the individual semiconductor nanoparticle.

20 Claims, 5 Drawing Sheets
(2 of 5 Drawing Sheet(s) Filed in Color)

(51) Int. Cl.
    *H10K 71/00*        (2023.01)
    *H10K 85/30*        (2023.01)
    *H10K 102/00*      (2023.01)

(52) U.S. Cl.
    CPC ... *H10K 2102/00* (2023.02); *H10K 2102/351* (2023.02)

(58) Field of Classification Search
    CPC ........ H10K 50/15; H10K 50/16; H10K 50/17; H10K 50/18; H10K 50/81; H10K 50/82; B82Y 40/00; B82Y 20/00; C09K 11/08; C09K 11/883; H01L 51/529; H01L 51/5064; H01L 51/56; H01L 27/3244; H01L 2251/301; H01L 2251/5369
    See application file for complete search history.

(56)               References Cited

U.S. PATENT DOCUMENTS

| | | | |
|---|---|---|---|
| 10,978,657 B2 | 4/2021 | Kim et al. | |
| 2007/0170839 A1* | 7/2007 | Choi ................. | H10K 50/8426 |
| | | | 313/500 |
| 2013/0240847 A1* | 9/2013 | Zakhidov .............. | H10K 50/81 |
| | | | 977/842 |
| 2017/0186986 A1* | 6/2017 | Lee ...................... | H10K 50/115 |
| 2017/0267924 A1* | 9/2017 | Kuwabata ................ | B01J 13/02 |
| 2018/0066183 A1* | 3/2018 | Torimoto ............ | C09K 11/621 |
| 2018/0255620 A1* | 9/2018 | Mao ....................... | H10K 50/82 |
| 2018/0366673 A1* | 12/2018 | Xie ................... | H10K 59/8052 |
| 2019/0067620 A1* | 2/2019 | Ning .................... | H10K 85/221 |
| 2019/0115555 A1* | 4/2019 | He ......................... | H10K 50/11 |
| 2019/0371994 A1* | 12/2019 | Kim .................... | H10N 10/852 |
| 2020/0006615 A1* | 1/2020 | Nakaya .................. | H02N 11/00 |
| 2020/0332191 A1 | 10/2020 | Kwon et al. | |
| 2021/0062087 A1* | 3/2021 | Kim ...................... | H05B 33/14 |
| 2021/0115332 A1 | 4/2021 | Kim et al. | |
| 2021/0115333 A1 | 4/2021 | Min et al. | |
| 2022/0002621 A1* | 1/2022 | Kim ...................... | C09K 11/02 |
| 2023/0074734 A1* | 3/2023 | Won .................... | H10K 50/115 |
| 2023/0096217 A1* | 3/2023 | Yoon ...................... | C09K 11/06 |
| | | | 257/40 |
| 2023/0121042 A1* | 4/2023 | Kim .................... | H10K 50/125 |
| | | | 257/40 |
| 2023/0133351 A1* | 5/2023 | Kim ...................... | H10K 71/00 |
| | | | 257/40 |

OTHER PUBLICATIONS

Chang-Yeol Han et al., "More Than 9% Efficient ZnSeTe Quantum Dot-Based Blue Electroluminescent Devices," ACS Energy Lett, Apr. 14, 2020, pp. 1568-1576, vol. 5.

Manfred Schmida et al., "Polymer Powders for Laser-Sintering: Powder Production and Performance Qualification," AIP Conference Proceedings, Feb. 6, 2019, pp. 1-5, vol. 2065, No. 020008.

Taehyung Kim et al., "Efficient and stable blue quantum dot light-emitting diode," Nature, Oct. 14, 2020, pp. 385-401, vol. 586.

* cited by examiner

SEMICONDUCTOR NANOPARTICLE WITH HIGH LEVEL OF CIRCULARITY AND ELECTROLUMINESCENT DEVICE INCLUDING SAME

CROSS-REFERENCE TO RELATED APPLICATION

This application claims priority to Korean Patent Application No. 10-2021-0113263 filed in the Korean Intellectual Property Office on Aug. 26, 2021, and all the benefits accruing therefrom under 35 U.S.C. § 119, the content of which in its entirety is herein incorporated by reference.

BACKGROUND

1. Field

The present disclosure relates to semiconductor nanoparticles and a device including the same.

2. Description of the Related Art

A semiconductor nanoparticle (e.g., semiconductor nanocrystal particle) may emit light. For example, a quantum dot including a semiconductor nanocrystal may exhibit a quantum confinement effect, showing, e.g., exhibiting, luminance properties. Light emission of semiconductor nanoparticle may be generated for example when an electron in an excited state, by light excitation or by application of a voltage, transitions from a conduction band to a valence band. The semiconductor nanoparticle may be configured to emit light of a desired wavelength region by controlling a size, composition, or a combination thereof of the semiconductor nanoparticle.

Nanoparticles may be used in a light emitting device (e.g., an electroluminescent light emitting device) and a display device including the same.

SUMMARY

An embodiment provides a luminescent device for example, capable of emitting light for example by applying a voltage to nanostructures (e.g., nanoparticles such as semiconductor nanoparticles).

An embodiment provides a display device (e.g., a QD-LED display) including a nanoparticle as a light emitting material in a blue pixel, a red pixel, a green pixel, or a combination thereof.

An embodiment provides a population of semiconductor nanoparticles.

An embodiment provides an electroluminescent device includes a first electrode; a second electrode spaced apart from the first electrode (e.g., each of the first electrode and the second electrode having a surface opposite the other, i.e., each with a surface, facing the other); and a light emitting layer disposed between the first electrode and the second electrode, the light emitting layer includes semiconductor nanoparticles, wherein the semiconductor nanoparticles do not include cadmium, the semiconductor nanoparticles have a core shell structure, the semiconductor nanoparticles include zinc, selenium, tellurium, and sulfur, wherein as confirmed in a two dimensional image obtained by an electron microscopy analysis, the semiconductor nanoparticles show an average value of a circularity defined by the following equation of greater than or equal to about 0.8 and less than or equal to about 1:

$$circularity = 4\pi \times \frac{Area}{[Perimeter]^2}$$

wherein Area is an area of a two dimensional image of an individual semiconductor nanoparticle, and Perimeter is a circumference of the two dimensional image of the individual semiconductor nanoparticle.

The electroluminescent device may further include a charge auxiliary layer between the light emitting layer and the first electrode, between the light emitting layer and the second electrode, or a combination thereof.

The charge auxiliary layer may include a hole auxiliary layer between the light emitting layer and the first electrode.

The charge auxiliary layer may include an electron auxiliary layer between the light emitting layer and the first electrode.

The charge auxiliary layer may include a hole auxiliary layer between the light emitting layer and the first electrode; an electron auxiliary layer between the light emitting layer and the first electrode; or a combination thereof.

The charge auxiliary layer may include a hole auxiliary layer including an organic compound, an electron auxiliary layer including metal oxide nanoparticles, or a combination thereof.

The semiconductor nanoparticles may include (e.g., a core comprising) a first semiconductor nanocrystal comprising (a first zinc chalcogenide including) zinc, selenium, and tellurium and (e.g., a shell disposed on the core and comprising) a second semiconductor nanocrystal comprising a (second) zinc chalcogenide and different from the first semiconductor nanocrystal.

An average size of the semiconductor nanoparticles may be greater than or equal to about 5 nanometers (nm).

An average size of the semiconductor nanoparticles may be less than or equal to about 50 nm.

The semiconductor nanoparticles may exhibit a standard deviation of the circularity of greater than or equal to about 0%, for example, greater than or equal to about 0.5% of the average value. The semiconductor nanoparticles may exhibit a standard deviation of the circularity of less than or equal to about 7%, less than or equal to about 6% of the average value.

The core shell structure may include a core including a first semiconductor nanocrystal and a semiconductor nanocrystal shell disposed on the core.

The first semiconductor nanocrystal may include (a first zinc chalcogenide including) zinc, selenium, and tellurium.

The semiconductor nanocrystal shell may include (a second zinc chalcogenide including) zinc and sulfur (e.g., a zinc sulfide). The semiconductor nanocrystal shell may further include selenium. The semiconductor nanocrystal shell may further include (a third zinc chalcogenide including) a zinc selenide, a zinc selenide sulfide, or a combination thereof. The third zinc chalcogenide may be disposed between the first semiconductor nanocrystal and the second zinc chalcogenide.

As determined by a transmissive electron microscopy analysis (e.g., a TEM– energy dispersive x-ray spectroscopy analysis or a TEM– Electron Energy Loss Spectroscopy (EESL) analysis) of the semiconductor nanoparticles, a thickness variance of the semiconductor nanocrystal shell determined by the following equation (or an average value thereof) may be less than or equal to about 0.3:

$$\text{thickness variance} = (T_{max} - T_{min})/(T_{max})$$

wherein $T_{max}$ is a maximum thickness of the semiconductor nanocrystal shell in a given semiconductor nanoparticle, and $T_{min}$ is a minimum thickness of the semiconductor nanocrystal shell in a given semiconductor nanoparticle.

In the semiconductor nanoparticles a mole ratio of tellurium to selenium may be greater than 0:1, greater than or equal to about 0.0001:1 or greater than or equal to about 0.0005:1.

In the semiconductor nanoparticles a mole ratio of tellurium to selenium may be less than or equal to about 0.1:1, or less than or equal to about 0.09:1

In the semiconductor nanoparticles, a mole ratio of a sum of sulfur and selenium to zinc may be less than or equal to about 3:1, or less than or equal to about 1.1:1.

In the semiconductor nanoparticles, a mole ratio of a sum of sulfur and selenium to zinc may be greater than or equal to about 0.88:1, or greater than or equal to about 0.9:1

The semiconductor nanoparticles may not include a Group III-V compound including indium or gallium or a combination thereof, or manganese or copper or a combination thereof.

The light emitting layer may exhibit a quantum yield (or quantum efficiency) of greater than 75% and less than or equal to about 100% when irradiated with light.

The light emitting layer may exhibit a quantum yield maintenance value of greater than or equal to about 80%, for example, greater than or equal to about 85%, or greater than or equal to about 90%, after a 30 minute heat treatment at about 80° C. The light emitting layer may exhibit a quantum yield maintenance value of less than or equal to about 100%, after a 30 minute heat treatment at about 80° C.

The light emitting layer may be configured to emit blue light when a voltage is applied between the first electrode and the second electrode. A maximum luminescent peak wavelength of the blue light may be greater than or equal to about 400 nm and less than or equal to about 500 nm.

In an embodiment, the light emitting device may exhibit a maximum external quantum efficiency (EQE) of greater than or equal to about 7.5%, greater than or equal to about 8% and less than or equal to about 40%, or less than or equal to about 30% and a maximum luminance of greater than or equal to about 10,000 candelas per square meter (cd/m²) and less than or equal to about 200,000 cd/m².

The maximum luminance may be greater than or equal to about 39000 cd/m² (or 39256 cd/m²) or greater than or equal to about 57000 cd/m² (or 57456 cd/m²).

In an embodiment, semiconductor nanoparticles not including cadmium and including zinc, selenium, tellurium, and sulfur, wherein the semiconductor nanoparticles are configured to emit blue light, wherein in a two dimensional image obtained by an electron microscopy analysis, the semiconductor nanoparticles show an average value of a circularity defined by the following equation of greater than or equal to about 0.8 and less than or equal to about 1:

$$\text{circularity} = 4\pi \times \frac{\text{Area}}{[\text{Perimeter}]^2}$$

wherein Area is an area of a two dimensional image of an individual semiconductor nanoparticle, and Perimeter is a circumference of the two dimensional image of the individual semiconductor nanoparticle.

An average size of the semiconductor nanoparticles may be greater than or equal to about 8 nm.

An average size of the semiconductor nanoparticles may be less than or equal to about 30 nm.

An average size of the semiconductor nanoparticles may be greater than or equal to about 9 nm and less than or equal to about 30 nm.

A particle size distribution, e.g., a relative standard deviation, of the semiconductor nanoparticles may be greater than or equal to about 3%, greater than or equal to about 5%, and less than or equal to about 15%.

The semiconductor nanoparticles may exhibit a standard deviation of the circularity that is greater than or equal to about 0%, greater than or equal to about 0.5% and less than or equal to about 7%, less than or equal to about 6.5%, less than or equal to about 6%, or less than or equal to about 5.5%.

The semiconductor nanoparticles may have a core including a first semiconductor nanocrystal and a semiconductor nanocrystal shell disposed on the core. The first semiconductor nanocrystal may include (a first zinc chalcogenide including) zinc, selenium, and tellurium. The semiconductor nanocrystal shell may include (a second zinc chalcogenide including) zinc and sulfur (e.g., a zinc sulfide). The semiconductor nanocrystal shell may further include a zinc selenide, a zinc selenide sulfide, or a combination thereof.

As determined by a transmissive electron microscopy analysis (e.g., a TEM– energy dispersive x-ray spectroscopy analysis or a TEM– electron energy loss spectroscopy image analysis) of the semiconductor nanoparticles, a thickness variance of the semiconductor nanocrystal shell determined by the following equation may be less than or equal to about 0.3:

$$\text{thickness variance} = (T_{max} - T_{min})/(T_{max})$$

wherein $T_{max}$ is a maximum thickness of the semiconductor nanocrystal shell in a given semiconductor nanoparticle, and $T_{min}$ is a minimum thickness of the semiconductor nanocrystal shell in a given semiconductor nanoparticle.

In the semiconductor nanoparticles a mole ratio of tellurium to selenium may be greater than 0 and less than or equal to about 0.1:1.

In the semiconductor nanoparticles, a mole ratio of a sum of sulfur and selenium to zinc may be greater than or equal to about 0.83:1, greater than or equal to about 0.9:1 and less than or equal to about 3:1, or less than or equal to about 1.1:1.

The semiconductor nanoparticles may not include an indium phosphide, a gallium phosphide (e.g., a Group III-V compound including indium or gallium or a combination thereof), or manganese or copper or a combination thereof.

In an embodiment, a method of producing the semiconductor nanoparticles may include conducting a reaction between a zinc precursor and a sulfur precursor in the presence of a particle including a first semiconductor nanocrystal including zinc, tellurium, and selenium to form a semiconductor nanocrystal shell to produce the semiconductor particles, wherein in the reaction, a mole ratio of the sulfur precursor to the zinc precursor may be greater than or equal to about 2.4:1.

The mole ratio of the sulfur precursor to the zinc precursor may be greater than or equal to about 2.5:1. The mole ratio of the sulfur precursor to the zinc precursor may be less than or equal to about 50:1, or less than or equal to about 10:1.

In an embodiment, semiconductor nanoparticles include a core including a first semiconductor nanocrystal including a first zinc chalcogenide including zinc, selenium, and tellurium; and a shell disposed on the core, the shell including a second semiconductor nanocrystal including a second zinc chalcogenide including zinc and sulfur (e.g., a zinc sulfide) and optionally a third zinc chalcogenide including zinc and selenium (e.g., a zinc selenide, a zinc selenide sulfide, or a combination thereof), wherein the semiconductor nanoparticles are configured to emit blue light having a maximum luminescent peak wavelength of greater than or equal to about 430 nanometers and less than or equal to about 480 nanometers, and as determined by a transmissive electron microscopy analysis (or TEM-EESL or TEM-EDX) of the semiconductor nanoparticles, a thickness variance of the semiconductor nanocrystal shell determined by the following equation (or an average value thereof) is less than or equal to about 0.3:

$$\text{thickness variance} = (T_{max} - T_{min})/(T_{max})$$

wherein $T_{max}$ is a maximum thickness of the semiconductor nanocrystal shell in a given semiconductor nanoparticle, and $T_{min}$ is a minimum thickness of the semiconductor nanocrystal shell in a given semiconductor nanoparticle.

The third zinc chalcogenide may be disposed on (e.g., directly on) the core and the second zinc chalcogenide may be disposed on (e.g., directly on) the third zinc chalcogenide.

In an embodiment, a display device or an electronic device may include the electroluminescent device or the semiconductor nanoparticles.

The display device or an electronic device may include (or may be) a handheld terminal, a monitor, a notebook computer, a television, an electronic display board, a camera, or a part for, e.g., of an automatic, e.g., autonomous, vehicle.

According to an embodiment, the semiconductor nanoparticles included in the light emitting layer (or light emitting film) may exhibit an improved shape factor. In the electroluminescent device, the light emitting layer including the semiconductor nanoparticles may exhibit improved stability (e.g., an oxidation stability, a thermal stability, a process stability, or a combination thereof).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings, in which.

6

Figure 4A:
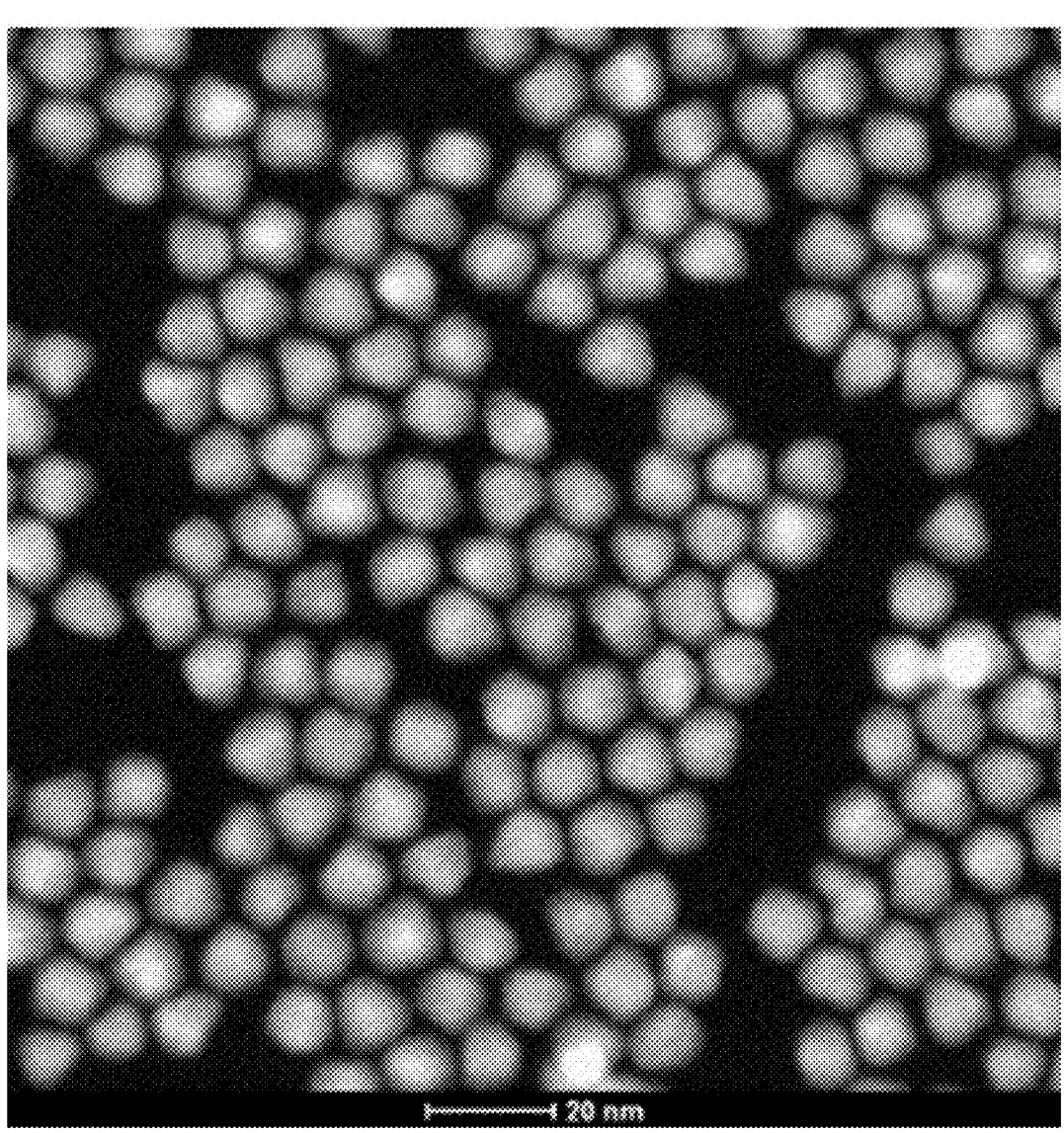
FIG. 4A is an electron microscopy image of the semiconductor nanoparticles prepared in Example 4.
Figure 4B:
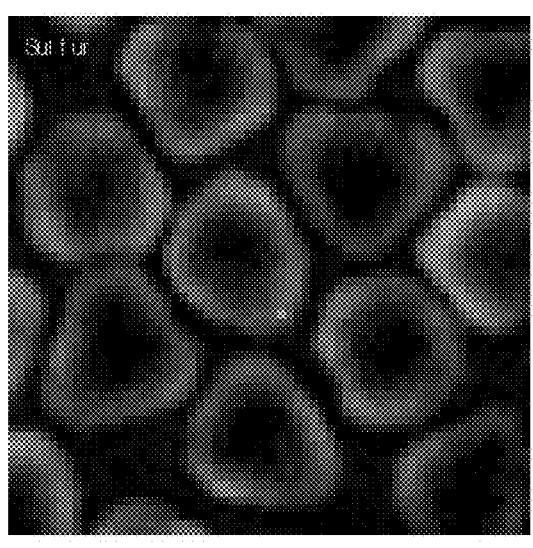

FIG. 4B is a transmission electron microscope-electron energy loss spectroscopy image of the semiconductor nanoparticles prepared in Example 4.

Figure 5A:
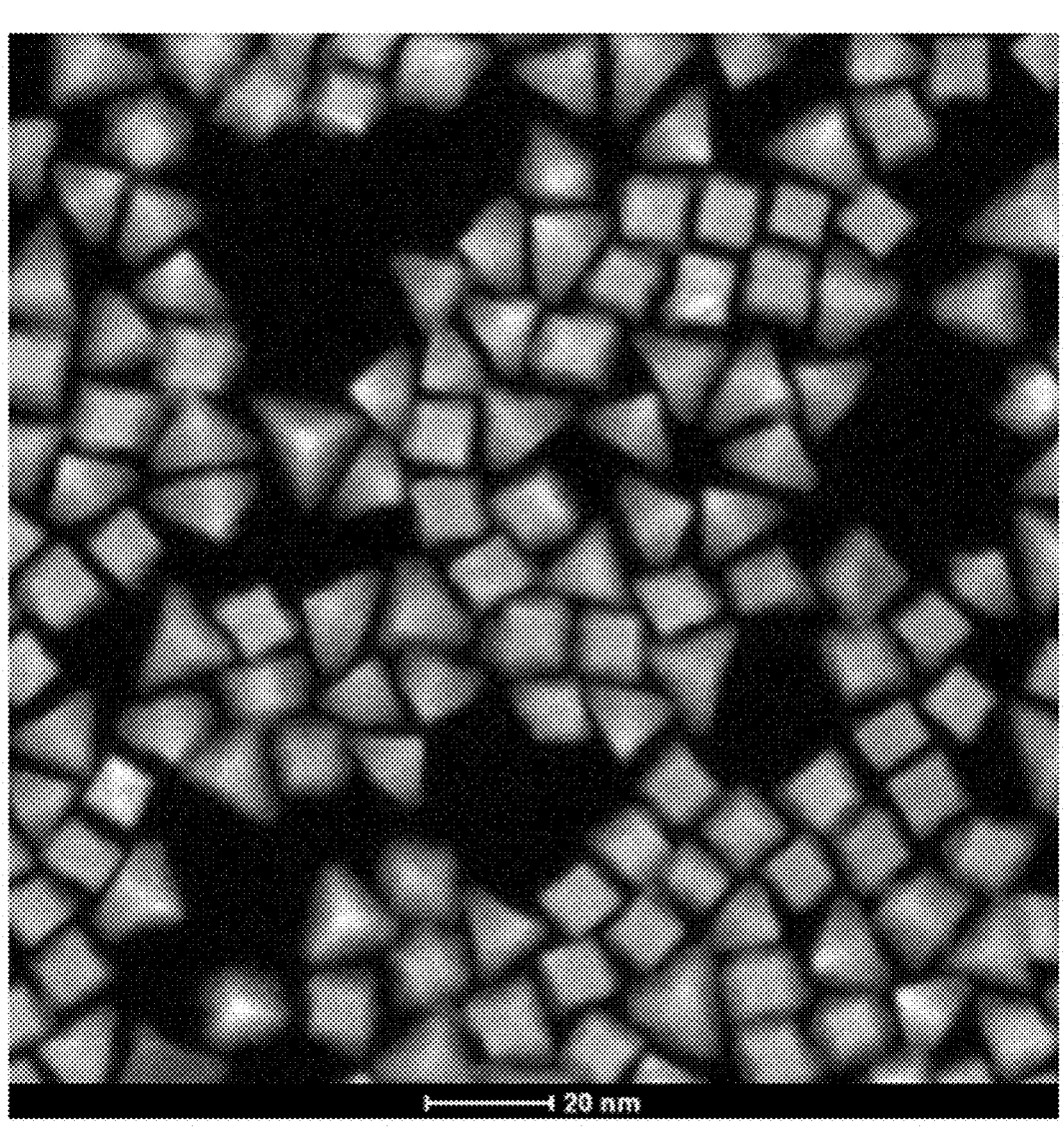

FIG. 5A is an electron microscopy image of the semiconductor nanoparticles prepared in Comparative Example 1.

Figure 5B:
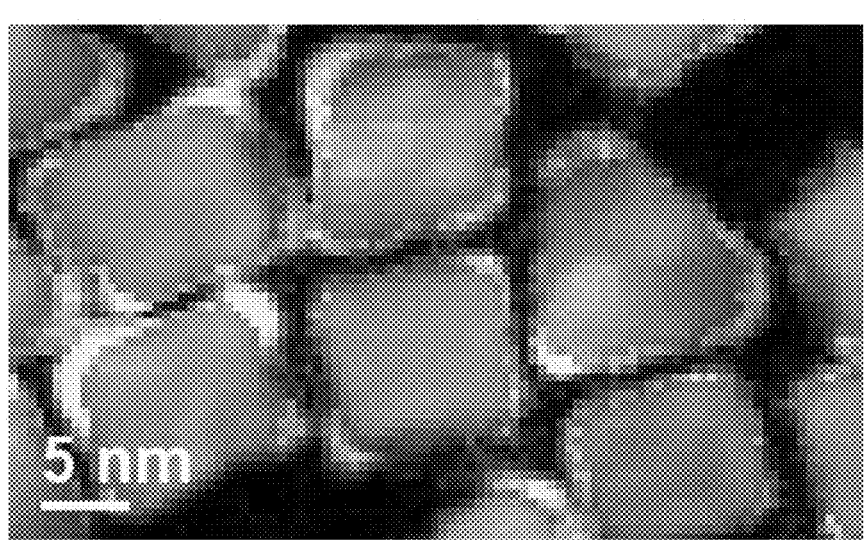

FIG. 5B is a transmission electron microscope-electron energy loss spectroscopy image of the semiconductor nanoparticles prepared in Comparative Example 1.

DETAILED DESCRIPTION

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Hereinafter, values of a work function, a conduction band, or a lowest unoccupied molecular orbital (LUMO) (or valence band or highest occupied molecular orbital (HOMO)) energy level is expressed as an absolute value from a vacuum level. In addition, when the work function or the energy level is referred to be "deep," "high" or "large," the work function or the energy level has a large absolute value based on "0 electronvolts (eV)" of the vacuum level, while when the work function or the energy level is referred to be "shallow," "low," or "small," the work function or energy level has a small absolute value based on "0 eV" of the vacuum level.

In an embodiment, the HOMO energy level, LUMO energy level, or a work function recited herein may be a value measured by an appropriate method, which is not particularly limited. In an embodiment, the HOMO energy level, LUMO energy level, or a work function recited herein may be measured by using a Cyclic Volumetry method, a spectroscopy method such as an ultraviolet-visible (UV-Vis) spectroscopy, Ultraviolet Photoelectron Spectroscopy (UPS), a Photoelectron spectroscopy in air (e.g., AC-3), a Kelvin Probe force microscopy, or a combination thereof.

As used herein, the term "Group" may refer to a group of Periodic Table. As used herein, "Group III" refers to Group IIIA and Group IIIB, and examples of Group IIIA metal may be Al, In, Ga, and Tl, and examples of Group IIIB may be scandium, yttrium, or the like, but are not limited thereto.

As used herein, "Group V" includes Group VA and includes nitrogen, phosphorus, arsenic, antimony, and bismuth, but is not limited thereto.

As used herein, the average (value) may be mean or median. In an embodiment, the average (value) may be a mean average.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having a carbon-carbon double bond.

As used herein, when a definition is not otherwise provided, "alkynyl" refers to a linear or branched monovalent hydrocarbon group having a carbon-carbon triple bond.

As used herein, when a definition is not otherwise provided, "aryl" refers to a group formed by removal of a, e.g., at least one, hydrogen from an arene (e.g., a phenyl or naphthyl group).

As used herein, when a definition is not otherwise provided, "hetero" refers to including 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" group is a group represented by —NRR, (R is each independently hydrogen, a C1-C12 alkyl group, a C7-C20 alkylarylene group, a C7-C20 arylalkylene group, or a C6-C18 aryl group.

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3%, or ±1% of the stated value.

As used herein, a nanostructure or a nanoparticle is a structure having a, e.g., at least one, region or characteristic dimension with a dimension of less than or equal to about 500 nm. In an embodiment, a dimension (or an average) of the nanostructure(s) is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape. The nanostructure may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanostructure or the nanoparticle can be, e.g., substantially crystalline, substantially monocrystalline, polycrystalline, (for example, at least partially) amorphous, or a combination thereof.

As used herein, the upper and lower endpoints set forth for various values may be independently combined to provide a range.

In an embodiment, a semiconductor nanoparticle such as a quantum dot may exhibit quantum confinement or exciton confinement. As used herein, the term "quantum dot" or "semiconductor nanoparticle" is not limited in shape unless otherwise defined. A semiconductor nanoparticle such as a quantum dot may have a size smaller than a Bohr excitation diameter for a bulk crystal material having an identical composition and may exhibit a quantum confinement effect. The semiconductor nanoparticle or the quantum dot may emit light corresponding to a bandgap energy of the semiconductor nanoparticle or the quantum dot by controlling a size of a nanocrystal acting as an emission center thereof.

As used herein, the term "T50(h)" is a time (hours (hr)) for the brightness (e.g., luminance) of a given device to decrease to 50% of the initial brightness (100%) when driven at a predetermined brightness (e.g., 650 nit).

As used herein, the phrase "external quantum efficiency (EQE)" is a percentage of the number of photons emitted from a light emitting diode (LED) relative to the number of electrons passing through the device, and can be a measurement as to how efficiently a given device converts electrons to photons and allows them to make an escape. The EQE can be determined by the following equation:

$$EQE = \text{an efficiency of injection} \times \text{a (solid-state) quantum yield} \times \text{an efficiency of extraction.}$$

Wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is a greatest value of the luminance a given device can achieve.

As used herein, the phrase quantum efficiency may be used interchangeably with a quantum yield. In an embodiment, the quantum efficiency may be a relative quantum yield or an absolute quantum yield, for example, which can be readily measured by any suitable commercially available equipment. The quantum efficiency (or quantum yield) may be measured in a solution state or a solid state (in a composite). In an embodiment, "quantum yield (or quantum efficiency)" may be a percentage of photons emitted relative to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

Unless mentioned to the contrary, a numerical range recited herein is an inclusive one.

The bandgap energy of the semiconductor nanoparticle may vary with a size and a composition of the nanostructure. For example, as a size(s) of the semiconductor nano particle(s) (e.g., the quantum dot(s)) increases, a bandgap energy (bandgap energies) of the semiconductor nanoparticle(s) may become narrower, e.g., decrease, and an emission wavelength(s) of light emitted by the semiconductor nanoparticle(s) may increase. A semiconductor nanocrystal may be used as a light emitting material in various fields such as a display device, an energy device, or a bio light emitting device. The luminescent nanostructures including the semiconductor nanocrystal and exhibiting an electroluminescent property of a practically applicable level may contain a harmful heavy metal such as cadmium (Cd), lead, mercury, or a combination thereof. Accordingly, it may be desirable to provide a light emitting device or a display device having a light emitting layer substantially free of the harmful heavy metal(s).

In an embodiment, an electroluminescent device may be a luminescent type of light emitting device configured to emit a desired light by applying a voltage in the absence of a separate light source. The light emitting device and the display device including the same may be advantageous in an environmental point of view.

Figure 1:
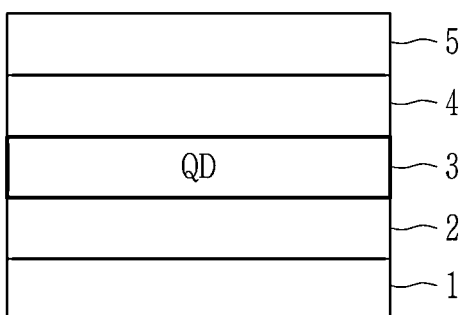
FIG. 1 is a schematic cross-sectional view of a light-emitting device according to an embodiment.

In an embodiment, an electroluminescent device includes a first electrode 1 and a second electrode 5 spaced apart each other (e.g., each having a surface opposite the other, i.e., each with a surface facing each other); and a light emitting layer 3 disposed between the first electrode 1 and the second electrode 5. (See FIG. 1) The light emitting layer may not contain cadmium. The first electrode may include an anode, and the second electrode may include a cathode. The first electrode may include a cathode and the second electrode may include an anode. In an embodiment, the electroluminescent device may further include a hole auxiliary layer 2 between the light emitting layer and the first electrode. In an embodiment, the electroluminescent device may further include an electron auxiliary layer 4 between the light emitting layer and the second electrode.

In the electroluminescent device of an embodiment, the first electrode 10 or the second electrode 20 may be disposed on a (transparent) substrate 100. The transparent substrate may be a light extraction surface. (See FIGS. 2 and 3).

Figure 2:
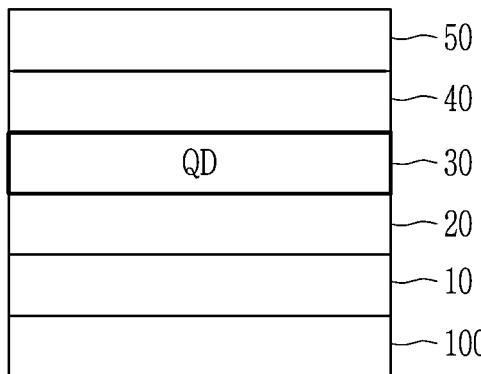
FIG. 2 is a schematic cross-sectional view of a light-emitting device according to an embodiment.
Figure 3:
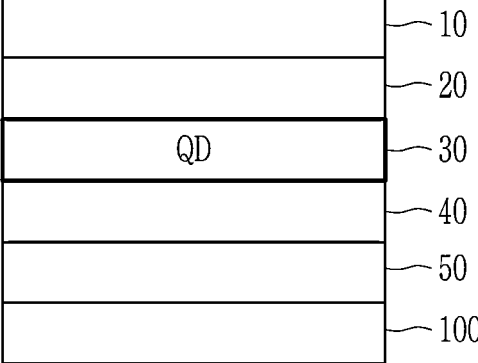
FIG. 3 is a schematic cross-sectional view of a light-emitting device according to an embodiment.

Referring to FIG. 2 and FIG. 3, in a light emitting device of an embodiment, a light emitting layer 30 may be disposed between a first electrode (e.g., anode) 10 and a second electrode (e.g., cathode) 20. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The electrode(s) may be patterned. The first electrode, the second electrode, or a combination thereof may be disposed on a (e.g., insulating) substrate. The substrate may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate may be a rigid or a flexible substrate. The substrate may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a thin metal thin film of a single layer or a plurality of layers, but is not limited thereto. If one of the first electrode and the second electrode is an opaque electrode, the opaque electrode may be made of an opaque conductor such as aluminum (Al), a lithium-aluminum (Li:Al) alloy, a magnesium-silver (Mg;Ag) alloy, or a lithium fluoride-aluminum (LiF:Al) compound.

The thickness of each of the electrodes (the first electrode, the second electrode, or each of the first electrode and the second electrode) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers ($\mu$m), less than or equal to about 90 $\mu$m, less than or equal to about 80 $\mu$m, less than or equal to about 70 $\mu$m, less than or equal to about 60 $\mu$m, less than or equal to about 50 $\mu$m, less than or equal to about 40 $\mu$m, less than or equal to about 30 $\mu$m, less than or equal to about 20 $\mu$m, less than or equal to about 10 $\mu$m, less than or equal to about 1 $\mu$m, less than or equal to about 900 nm, less than or equal to about 500 nm, or less than or equal to about 100 nm.

The light emitting layer 30 disposed between the first electrode and the second electrode (e.g., the anode 10 and the cathode 50) may include a semiconductor nanoparticle (e.g., blue light emitting nanostructures, and optionally red light emitting nanostructures, green light emitting nanostructures, or a combination thereof). The semiconductor nanoparticles may not comprise cadmium. The light emitting layer may include one or more (e.g., 2 or more or 3 or more and 10 or less) monolayers of a plurality of nanostructures. The semiconductor nanoparticles may include semiconductor nanoparticles having a core-shell structure.

The light emitting layer may be patterned. In an embodiment, the patterned light emitting layer may include a blue light emitting layer disposed in the blue pixel. In an embodiment, the light emitting layer may further include a red light emitting layer disposed in the red pixel, a green light emitting layer disposed in the green pixel, or a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer(s), the green light emitting layer(s), and the blue light emitting layer(s). The red light emitting layer, the green light emitting layer, and the blue light emitting layer may be optically isolated from each other.

The light emitting layer or the semiconductor nanoparticles may not include cadmium. The light emitting layer or the semiconductor nanoparticles may not include lead, or a combination thereof.

In an embodiment, the semiconductor nanoparticles included in the light emitting layer (e.g., light emitting film) 3 or 30 may have a core shell structure and may include zinc, selenium, tellurium, and sulfur. An embodiment is related to the semiconductor nanoparticles or a population thereof.

The semiconductor nanoparticles may include a first semiconductor nanocrystal including zinc, selenium, and tellurium and a second semiconductor nanocrystal including a zinc chalcogenide and having different composition from the first semiconductor nanocrystal. In an embodiment, the core shell structure may include a core including the first semiconductor nanocrystal and a shell (e.g., a semiconductor nanocrystal shell) disposed on the core and including the second semiconductor nanocrystal.

In an embodiment, the semiconductor nanoparticles may have an average particle size (e.g., the diameters or equivalent diameters of the particles that can be determined with an electron microscope) of greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 10.5 nm, greater than or equal to about 11 nm, or greater than or equal to about 12 nm. In an embodiment, the (average) size(s) of the nanoparticle(s) may be less than or equal to about 50 nm, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10.8 nm, or less than or equal to about 10.7 nm. In an embodiment, an average size of nanoparticles may be in a range of about 5 nm to about 12 nm, about 6 nm to about 11 nm, about 7 nm to about 10 nm, about 8 nm to about 9 nm, or a combination thereof. As used herein, the average may be a mean average. As used herein, the average may be a median. As used herein, the numerical value may be a lower or upper limit of a range.

In an embodiment, the semiconductor nanoparticles may exhibit a standard deviation of the particle sizes that is about 1% to about 20%, about 2% to about 19%, about 3% to about 18%, about 4% to about 17%, about 5% to about 16%, about 6% to about 14%, about 7% to about 13%, about 8% to about 12%, about 9% to about 11%, or a combination thereof, based on an average size thereof. In an embodiment, the standard deviation of the sizes of the semiconductor nanoparticles may be less than or equal to about 10%, less than or equal to about 9%, less than or equal to about 8%, less than or equal to about 7%, less than or equal to about 6%, or less than or equal to about 5% of an average value of the particle sizes.

In an embodiment, the particle size may be readily and reproducibility analyzed and obtained by using an image (a two-dimensional image) obtained from an electron microscopic analysis (e.g., a transmission electron microscopy analysis or a scanning electron microscopy) and using any appropriate (known or commercially available) image analysis program such as "image J," for example, according to a manual provided with a manufacturer. The image analysis tool and measurement conditions (e.g., a smoothing number) are not particularly limited.

In an embodiment, the nanoparticles (e.g., the core or the shell) may include or may not include an indium phosphide, a gallium phosphide, an indium gallium phosphide (e.g., a Group III-V compound including indium, gallium, or a combination thereof); or may or may not include manganese, copper, or a combination thereof. In an embodiment, the nanoparticles (e.g., the core or the shell) do not include a Group III-V compound including indium, a Group III-V compound including gallium, manganese, copper, or a combination thereof.

In an embodiment, the first semiconductor nanocrystal or the core may include (e.g., a zinc chalcogenide including) zinc and selenium, and optionally further include tellurium. A size (or an average size) of the core(s) may be greater than or equal to about 2 nm, greater than or equal to about 3 nm, or greater than or equal to about 4 nm. A size (or an average size) of the core may be less than or equal to about 6 nm, or less than or equal to about 5 nm. The first semiconductor nanocrystal may include $ZnTe_xSe_{1-x}$ (wherein x is greater than 0, greater than or equal to about 0.001, greater than or equal to about 0.003, greater than or equal to about 0.005, greater than or equal to about 0.007, greater than or equal to about 0.009, greater than or equal to about 0.01, greater than or equal to about 0.03, greater than or equal to about 0.05, greater than or equal to about 0.09 and less than 0.1, or less than or equal to about 0.04).

In the semiconductor nanoparticles, the semiconductor nanocrystal shell or the zinc chalcogenide included therein may include zinc (Zn), selenium (Se), and sulfur (S). The shell may be a multi-layered shell including a plurality of layers. In the plurality of layers for the shell, adjacent layers may have semiconductor nanocrystal material of different compositions. The multi-layered shell may include a first shell layer disposed directly on the core and an outer layer (e.g., a second layer) disposed on or over the first layer. The first shell layer may include a semiconductor nanocrystal that is different from the first semiconductor nanocrystal and may include zinc, selenium, and optionally further include sulfur. The first shell layer or the semiconductor nanocrystal included therein may include or may not include sulfur. The outer shell layer (e.g., the second shell layer) or a semiconductor nanocrystal included therein may include a semiconductor nanocrystal having a composition different from the semiconductor nanocrystal included in the first shell layer and may include zinc and sulfur. The outer shell layer (e.g., the second shell layer) may be the outermost layer of the quantum dot. The multi-layered shell may include a first shell layer including a zinc selenide, a zinc selenide sulfide, or a combination thereof and an outer layer on the first shell layer and including a zinc sulfide.

In the shell or the multi-layered shell, each of the layers may include a gradient composition varying in a direction of a radius, e.g., a radial direction from the core toward an outermost surface layer of the quantum dot. In an embodiment, an amount of the sulfur in the semiconductor nanocrystal shell layer may increase toward a surface of the quantum dot. For example, in the shell, the amount of the sulfur may increase in a direction away from the core, e.g., in a radial direction from the core toward an outermost surface of the quantum dot.

In the semiconductor nanoparticles, a mole ratio of tellurium to selenium (Te:Se) (e.g., measured by inductively coupled plasma-atomic emission spectroscopy (ICP-AES)) that is less than or equal to about 0.1:1, less than or equal to about 0.08:1, less than or equal to about 0.07:1, less than or equal to about 0.06:1, less than or equal to about 0.05:1, less than or equal to about 0.045:1, less than or equal to about 0.04:1, less than or equal to about 0.035:1, less than or equal to about 0.03:1, less than or equal to about 0.025:1, less than or equal to about 0.02:1, less than or equal to about 0.015:1, less than or equal to about 0.01:1, less than or equal to about 0.009:1, less than or equal to about 0.008:1, less than or equal to about 0.007:1, less than or equal to about 0.006:1, or less than or equal to about 0.005:1.

The mole ratio of the tellurium to the selenium may be greater than or equal to about 0.0001:1, greater than or equal to about 0.00015:1, greater than or equal to about 0.0002:1, greater than or equal to about 0.00025:1, greater than or equal to about 0.0003:1, greater than or equal to about 0.00035:1, greater than or equal to about 0.0004:1, greater than or equal to about 0.00045:1, greater than or equal to about 0.0005:1, greater than or equal to about 0.00055:1, greater than or equal to about 0.006:1, greater than or equal to about 0.00065:1, greater than or equal to about 0.0007:1, greater than or equal to about 0.00075:1, greater than or equal to about 0.0008:1, greater than or equal to about 0.00085:1, greater than or equal to about 0.0009:1, greater than or equal to about 0.00095:1, greater than or equal to about 0.001:1, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004:1, or greater than or equal to about 0.0045:1.

In an embodiment, a mole ratio of tellurium to selenium may be from about 0.004:1 to about 0.01:1. In an embodiment, a mole ratio of tellurium to selenium may be from about 0.0002:1 to about 0.02:1. In an embodiment, a mole ratio of tellurium to selenium may be from about 0.0003:1 to about 0.03:1.

In the semiconductor nanoparticles, a mole ratio of the tellurium to the zinc (Te:Zn) (e.g., determined by an inductively coupled plasma-atomic emission spectroscopy) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.010:1, less than or equal to about 0.009:1, less than or equal to about 0.008:1, less than or equal to about 0.007:1, less than or equal to about 0.006:1, or less than or equal to about 0.005:1. A mole ratio of the tellurium to the zinc may be greater than or equal to about 0.0001:1, greater than or equal to about 0.0002:1, greater than or equal to about 0.0003:1, greater than or equal to about 0.0004:1, greater than or equal to about 0.0005:1, greater than or equal to about 0.0006:1, greater than or equal to about 0.0007:1, greater than or equal to about 0.0008:1, greater than or equal to about 0.0009:1, greater than or equal to about 0.001:1, greater than or equal to about 0.0011:1, greater than or equal to about 0.0012:1, greater than or equal to about 0.0013:1, greater than or equal to about 0.0014:1, greater than or equal to about 0.0015:1, greater than or equal to about 0.0018:1, greater than or equal to about 0.0019:1 or greater than or equal to about 0.002:1.

In an embodiment, in the ICP-AES analysis, a mole ratio of Se to Zn may be less than or equal to about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, less than or equal to about 0.45:1, or less than or equal to about 0.4:1.

In an embodiment, (for example, in the ICP-AES analysis) a mole ratio of Se to Zn may be greater than or equal to about 0.1:1, for example, greater than or equal to about 0.2:1, greater than or equal to about 0.3:1, greater than or equal to about 0.4:1, or greater than or equal to about 0.45:1, greater than or equal to about 0.46:1, greater than or equal to about 0.48:1, greater than or equal to about 0.5:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, or greater than or equal to about 0.6.

In the semiconductor nanoparticles of an embodiment, a mole ratio of a total of Se and S to zinc ((Se+S):Zn) may be greater than or equal to about 0.88:1, greater than or equal to about 0.89:1, greater than or equal to about 0.9:1, greater than or equal to about 0.91:1, greater than or equal to about 0.92:1, greater than or equal to about 0.93:1, greater than or equal to about 0.94:1, greater than or equal to about 0.95:1, greater than or equal to about 0.96:1, greater than or equal to about 0.97:1, greater than or equal to about 0.98:1, greater than or equal to about 0.99:1, or greater than or equal to about 1:1. In the semiconductor nanoparticles of an embodiment, a mole ratio of a sum of Se and S to zinc ((Se+S):Zn) may be less than or equal to about 3:1, less than or equal to about 2.5:1, less than or equal to about 2:1, less than or equal to about 1.5:1, or less than or equal to about 1.2:1.

In the semiconductor nanoparticles of an embodiment, a mole ratio of sulfur to selenium may be less than or equal to about 2.4:1. In the quantum dot, a mole ratio of sulfur to selenium may be less than or equal to about 2:1, less than or equal to about 1.95:1, less than or equal to about 1.9:1, less than or equal to about 1.85:1, less than or equal to about 1.80:1, less than or equal to about 1.40:1, less than or equal to about 1.25:1, less than or equal to about 1.19:1, less than or equal to about 0.95:1, less than or equal to about 0.80:1, less than or equal to about 0.75:1, less than or equal to about 0.7:1, or less than or equal to about 0.69:1. In the semiconductor nanoparticles of an embodiment, a mole ratio of sulfur to selenium may be greater than or equal to about 0.4:1, greater than or equal to about 0.5:1, greater than or equal to about 0.6:1, greater than or equal to about 0.7:1, greater than or equal to about 0.95:1, greater than or equal to about 1:1, greater than or equal to about 1.1:1, greater than or equal to about 1.23:1, greater than or equal to about 1.25:1, greater than or equal to about 1.3:1, greater than or equal to about 1.4:1, or greater than or equal to about 1.95:1.

The semiconductor nanoparticles may be configured to emit blue light. In an embodiment, the semiconductor nanoparticles may emit blue light with light excitation or application of a voltage, and a maximum luminescent peak wavelength of the light may be greater than or equal to about 430 nm (for example, greater than or equal to about 435 nm, greater than or equal to about 440 nm, greater than or equal to about 446 nm, greater than or equal to about 449 nm, or greater than or equal to about 450 nm) and less than or equal to about 480 nm (for example, less than or equal to about 470 nm, less than or equal to about 465 nm, less than or equal to about 460 nm, or less than or equal to about 455 nm).

As indium phosphide based compound and a zinc selenium based compound optionally including tellurium are exemplary semiconductor nanoparticles including substantially no cadmium and emitting blue light. To emit blue light of a desired wavelength, an indium phosphide based compound may have a reduced core size of less than or equal to about 2 nm, which may pose relatively serious technological drawbacks in terms of a synthesis and handling thereof. A relatively large bandgap energy of a zinc selenium based compound may make it difficult to obtain a blue light of a desired wavelength. Including tellurium in a zinc selenium based compound may allow for control of the wavelength within a desired range. The present inventors have found that semiconductor nanoparticles including a zinc-selenium-tellurium compound may tend to have a multi-pod shape, a cubic shape, or a combination thereof. A population of nanoparticles having a multi-pod shape or a tetrahedron or cubic shape may have a relatively low level of circularity, e.g., small average circularity, in terms of the particle shape parameter explained in detail herein.

In an embodiment, the circularity is a shape factor about how a cross-section of a given particle is close to a circle taking into consideration a smoothness of a perimeter. The circularity may be determined by the following definition in a two dimensional image obtained by an electron microscopy analysis:

$$\text{circularity} = 4\pi \times \frac{\text{Area}}{[\text{Perimeter}]^2}$$

wherein "Area" is an area of a two dimensional image(s) of individual semiconductor nanoparticle(s), and "Perimeter" is a circumference of a two dimensional image(s) of individual semiconductor nanoparticle(s).

The circularity may be a flat projection of sphericity and may be a shape factor representing the sphericity. In an embodiment, the semiconductor nanoparticles may have a relatively higher, e.g., larger, sphericity than a cadmium free semiconductor nanoparticle including a zinc-tellurium-selenium compound. In an embodiment, the circularity of the semiconductor nanoparticles may represent a different aspect from a solidity or a roundness.

The solidity, S is defined by the following equation, as the image area A, divided by the convex hull area, Ac.

$$S = \frac{A}{A_C}$$

A: an area of a two dimensional image of an individual semiconductor nanoparticle Ac: an area of a convex hull the two dimensional image of an individual semiconductor nanoparticle The roundness may be defined by the following equation:

$$\text{roundness } \frac{4 \times \text{area}}{\pi \times (\text{major axis})^2}$$

wherein area: an area of a two dimensional image of an individual semiconductor nanoparticle, and major axis: a longest diameter of the semiconductor nanoparticle.

The shape factors (e.g., the circularity, the solidity, or the roundness) may be obtained readily and reproducibility from a two dimensional electron microcopy image of the particles using a universal image analysis program (e.g., Image J developed by NIH) and a manual of the program producer (e.g., Image J User Guide IJ 1.46r) or an in-house image program made by a coding language (e.g., a commercially available coding language such as Metalab).

The circularity is a shape factor different from the solidity and the roundness. In an embodiment, a given particle is a sphere shape and a projected shape of the given particle is a circle, and the solidity, the roundness, and the circularity of the given particle are all one (1). In an embodiment, a given particle has a cubic shape, and a projected shape of the given particle is a square, and thus, the solidity and the roundness thereof are about 1 and about 0.897, respectively, but a circularity of the given particle is relatively low e.g., small, i.e., 0.785. In addition, in an embodiment, a given particle has a tetrahedron shape, and a projected shape of the given particle is near, e.g., similar, to a triangle and a solidity of the given particle may be as high, e.g., large, as about 1, but a roundness and circularity of the given particle are 0.552 and 0.605, respectively, which are relatively low, e.g., small. In an embodiment, a given particle has a relatively rough perimeter such as a multi-pod shape, and a flat projection of the given particle may have a star shape, a roundness of the given particle may be relatively high, e.g., large (i.e., 0.9), but a solidity and circularity of the given particle are less than 0.6 and about 0.4, respectively, which are relatively low, e.g., small.

The present inventors have found that when a population of semiconductor nanoparticles including a zinc-selenium-tellurium compound may include a multi-pod shape, a tetrahedron shape, a cubic shape, or a combination thereof, the shape factor for the population exhibit a relatively low level of circularity, e.g., small average circularity. Without wishing to be bound by any theory, it is believed that such a low level of circularity, e.g., small average circularity, results from an irregular growth of the shell disposed on the core for example having the low circularity. In an embodiment, the semiconductor nanoparticles having a core shell structure and including zinc, selenium, and tellurium may have as an outermost layer a shell including a zinc sulfide (ZnS), which has a relatively high, e.g., large, bandgap energy and has a thickness of greater than or equal to a predetermined thickness. Such a ZnS shell may allow for an electron (e−) and a hole (h+) to be confined properly. In this regard, the present inventors have found that in semiconductor nanoparticles in which a uniform coating of the ZnS shell may not be achieved, the final nanoparticles may not have a desired level of shape factors (e.g., a relatively high level of circularity, e.g., large average circularity). Without wishing to be bound by any theory, the ZnS shell may tend to grow in a predetermined crystalline direction (e.g., a <111> direction), thus the coating may mainly occur at edges of the core including zinc, selenium, and tellurium, thereby the final nanoparticles may have predominant shapes that is a multi-pod shape, a tetrahedron shape, a cubic shape, or a combination thereof, exhibiting a relatively low level of circularity e.g., small average circularity.

The present inventors have also found that in semiconductor nanoparticles including a un-uniformly, e.g., nonuniformly, grown ZnS shell, the resulting shapes including multi-pod shapes, tetrahedron shapes, cubic shapes, or a combination thereof have an adverse effect, for example, in a process stability. For example, the nanoparticles having the un-uniformly, e.g., nonuniformly, grown ZnS shell may be very susceptible to an oxidation (e.g., a thermal oxidation), which may cause a relatively serious defect in an electroluminescent device.

Surprisingly, the present inventors have found that a precursor ratio during a shell coating (for example, a precursor ratio of the sulfur to the zinc) may affect the shape factors of the nanoparticles and by controlling the same, a population of the semiconductor nanoparticles having the aforementioned circularity may be obtained.

In an embodiment, as determined by a two dimensional image from an electron microscopy analysis, the semiconductor nanoparticles may have an average value of the circularity of greater than or equal to about 0.76, greater than or equal to about 0.77, greater than or equal to about 0.78, greater than or equal to about 0.79, greater than or equal to about 0.8, greater than or equal to about 0.81, greater than or equal to about 0.82, greater than or equal to about 0.83, greater than or equal to about 0.84, or greater than or equal to about 0.85. In an embodiment, as determined by a two dimensional image from an electron microscopy analysis, the semiconductor nanoparticles may have an average value of the circularity of less than or equal to about 1, less than or equal to about 0.99, less than or equal to about 0.98, less than or equal to about 0.97, less than or equal to about 0.96, less than or equal to about 0.95, less than or equal to about 0.94, less than or equal to about 0.93, less than or equal to about 0.92, less than or equal to about 0.91, less than or equal to about 0.9, less than or equal to about 0.89, less than or equal to about 0.88, or less than or equal to about 0.87.

In an embodiment, the circularity of the semiconductor nanoparticles may have a standard deviation of greater than or equal to about 0%, for example, greater than or equal to about 0.1%, greater than or equal to about 0.5%, or greater than or equal to about 0.7% of an average value thereof.

In an embodiment, the circularity of the semiconductor nanoparticles may have a standard deviation of less than or equal to about 7%, for example, less than or equal to about 6%, less than or equal to about 5%, less than or equal to about 4%, less than or equal to about 3%, less than or equal to about 2.5%, less than or equal to about 2%, less than or equal to about 1.5%, or less than or equal to about 1% of an average value thereof.

In an embodiment, in addition to the aforementioned range of the circularity, the semiconductor nanoparticles may exhibit a relatively high level of solidity, roundness, or a combination thereof, e.g., large average solidity, roundness, or a combination thereof).

In an embodiment, (a population of) the semiconductor nanoparticles may exhibit a solidity that is greater than or equal to about 0.9, greater than or equal to about 0.91, greater than or equal to about 0.92, greater than or equal to about 0.93, greater than or equal to about 0.94, greater than or equal to about 0.95, and less than or equal to about 1, less than or equal to about 0.99, less than or equal to about 0.98, less than or equal to about 0.97, less than or equal to about 0.96, or less than or equal to about 0.95.

In an embodiment, (a population of) the semiconductor nanoparticles may exhibit a roundness of greater than or equal to about 0.85, greater than or equal to about 0.86, greater than or equal to about 0.87, greater than or equal to about 0.88, greater than or equal to about 0.89, greater than or equal to about 0.9, greater than or equal to about 0.91, greater than or equal to about 0.92, greater than or equal to about 0.93, greater than or equal to about 0.94, or greater than or equal to about 0.95, and less than or equal to about 1, less than or equal to about 0.99, less than or equal to about 0.98, less than or equal to about 0.97, less than or equal to about 0.96, less than or equal to about 0.95, less than or equal to about 0.94, less than or equal to about 0.93, less than or equal to about 0.92, or less than or equal to about 0.91.

In an embodiment, by a uniform shell coating, the semiconductor nanoparticles may exhibit an improved particle size distribution.

In an embodiment, the semiconductor nanoparticles may have a relatively uniform shell coating, and thus as determined by a transmissive electron microscopy analysis (e.g., a TEM-EDX analysis or a TEM-EESL analysis) of the semiconductor nanoparticles, a thickness variance of the semiconductor nanocrystal shell determined by the following equation (or an average value for a particle population) may be less than or equal to about 0.5, less than or equal to about 0.4, less than or equal to about 0.3, less than or equal to about 0.28, less than or equal to about 0.25, less than or equal to about 0.23, less than or equal to about 0.21, less than or equal to about 0.19, less than or equal to about 0.17, less than or equal to about 0.15, less than or equal to about 0.13, less than or equal to about 0.11, or less than or equal to about 0.1:

$$\text{thickness variance} = (T_{max} - T_{min})/(T_{max})$$

wherein $T_{max}$: a maximum thickness of the semiconductor nanocrystal shell (for example, a ZnS shell) in a given semiconductor nanoparticle; and $T_{min}$: a minimum thickness of the semiconductor nanocrystal shell in a given semiconductor nanoparticle.

In an embodiment, the thickness variance (or an average value thereof) may be greater than or equal to about 0, greater than or equal to about 0.01, greater than or equal to about 0.05, greater than or equal to about 0.09, greater than or equal to about 0.1, greater than or equal to about 0.2, greater than or equal to about 0.3, greater than or equal to about 0.4, or greater than or equal to about 0.45.

In the semiconductor nanoparticles of an embodiment, a ZnS shell may be impart a more improved stability (e.g., oxidation/process stability) in comparison with a ZnSe shell, and it is believed that a uniform ZnS coating in the semiconductor nanoparticle of an embodiment may provide improved oxidation/process stability. In an embodiment, the average value of circularity recited herein may indicate a presence of a more uniform ZnS shell coating for the semiconductor nanoparticles, exhibiting a more improved oxidation/process stability.

In an embodiment, the semiconductor nanoparticles may exhibit improved stability against a chemical charging. In an embodiment, the semiconductor nanoparticles may be subjected to a doping experimentation wherein the semiconductor nanoparticles are dispersed in a C6-20 alkane solvent (e.g., hexane) and a predetermined dopant (e.g., a reducing agent such as lithium triethylborohydride) is added at a predetermined concentration (e.g., 1.3 mM) and then the quantum efficiency (or quantum yield) of the semiconductor nanoparticles after the addition of the dopant is greater than or equal to about 20%, greater than or equal to about 25%, greater than or equal to about 30%, greater than or equal to about 35%, or greater than or equal to about 40% of a quantum efficiency (or quantum yield) of the semiconductor nanoparticles prior to the addition of the dopant.

In an embodiment, a quantum efficiency (or quantum yield) of the semiconductor nanoparticles after the addition of the dopant may be less than or equal to about 100%, less than or equal to about 95%, less than or equal to about 90%, less than or equal to about 80%, less than or equal to about 70%, less than or equal to about 60%, or less than or equal to about 50% of a quantum efficiency (or quantum yield) thereof prior to the addition of the dopant.

In an embodiment, as the semiconductor nanoparticles in a solution state or in a light emitting film are irradiated with light, a quantum efficiency (or a quantum yield) may be greater than or equal to about 75%, for example, greater than or equal to about 76%, greater than or equal to about 77%, greater than or equal to about 78%, greater than or equal to about 79%, greater than or equal to about 80%, greater than or equal to about 81%, greater than or equal to about 82%, greater than or equal to about 83%, greater than or equal to about 84%, or greater than or equal to about 85%. In an embodiment, as the semiconductor nanoparticles in a solution state or in a light emitting film are irradiated with light, a quantum efficiency (or a quantum yield) may be from about 76% to about 100%, from about 80% to about 95%, from about 82% to about 92%, or a combination thereof. In an embodiment, the quantum efficiency (or the quantum yield) may be an absolute quantum efficiency (yield) or a relative quantum efficiency (yield).

In an embodiment, as the light emitting film or layer including the semiconductor nanoparticles is heat-treated at a temperature of about 80° C. for about 30 minutes, a maintenance value of the quantum efficiency (i.e., a percentage of a quantum efficiency after the heat treatment with respect to an initial quantum efficiency i.e., prior to the heat treatment) may be greater than or equal to about 78%, greater than or equal to about 79%, greater than or equal to about 80%, greater than or equal to about 81%, greater than or equal to about 82%, greater than or equal to about 83%, greater than or equal to about 84%, greater than or equal to about 85%, greater than or equal to about 86%, greater than or equal to about 87%, greater than or equal to about 88%, greater than or equal to about 89%, or greater than or equal to about 90%. In an embodiment, the maintenance value may be in a range of about 80% to about 100%, about 85% to about 98%, about 86% to about 97%, about 87% to about 97%, or a combination thereof.

In an embodiment, the semiconductor nanoparticles may exhibit (a maximum luminescent peak with) a full width at half maximum of about 10 nm to about 40 nm, about 15 nm to about 35 nm, about 20 nm to about 30 nm, about 25 nm to about 28 nm, or a combination thereof.

In an embodiment, the semiconductor nanoparticles may include fluorine, chlorine, or a combination thereof. In an embodiment, the semiconductor nanoparticles may not include fluorine, chlorine, or a combination thereof.

In an embodiment, the semiconductor nanoparticles may be prepared in accordance with the method described herein. In an embodiment, a method producing the semiconductor nanoparticles includes conducting a reaction between a zinc precursor and a sulfur precursor in the presence of a first particle including the first semiconductor nanocrystal including zinc, selenium, and tellurium to form a semiconductor nanocrystal shell including zinc and sulfur (i.e., a ZnS semiconductor nanocrystal shell) on the, wherein in the reaction for a ZnS shell coating, a mole ratio of the sulfur to the zinc (hereinafter, S:Zn mole ratio) may be controlled to be greater than or equal to about 2.4:1.

In an embodiment, the first semiconductor nanocrystal (or the core) may be obtained by reacting a zinc precursor, a selenium precursor, and a tellurium precursor in an organic solvent in the presence of an organic ligand. In an embodiment, the first semiconductor nanocrystal (or the core) may be obtained by preparing a zinc precursor solution including a zinc precursor and an organic ligand; preparing a selenium precursor and a tellurium precursor; heating the zinc precursor solution in a reactor vessel to a first reaction temperature and adding the selenium precursor and the tellurium precursor to the vessel, optionally together with an organic ligand, to achieve a reaction between the added precursor components. In the core or the first semiconductor nanocrystal, a mole ratio of tellurium to selenium may be controlled appropriately taking into consideration a desired composition of the semiconductor nanoparticles. The core thus prepared may be removed from the reaction system to be added to a shell formation reaction.

In an embodiment, prior to the reaction between the zinc precursor and the sulfur precursor, the method further include conducting a reaction between a zinc precursor and a chalcogen element precursor (for example, a selenium precursor, a tellurium precursor, or a combination thereof and optionally a sulfur precursor) and forming a nanocrystal shell layer (for example, a ZnSe layer, a ZnTeSe layer, a ZnTe layer, a ZnSeS layer, a ZnTeS layer, a ZnTeSeS layer, or a combination thereof between the core (or the first semiconductor nanocrystal) and the ZnS shell layer. The formation of the semiconductor nanocrystal shell may include reacting a zinc precursor with selenium precursor and then reacting a zinc precursor and a sulfur precursor.

The zinc precursor may include a Zn metal powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenyl phosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), a bis(trialkylsilyl) sulfide (e.g., bis(trimethylsilyl) sulfide), a bis(trialkylsilyl) alkyl sulfide (e.g., bis(trimethylsilyl) methylsulfide, ammonium sulfide, sodium sulfide, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one, (e.g., 1, 2, or 3) C6 to C22 alkyl group, a primary, secondary, or tertiary phosphine oxide (e.g., trioctylphosphine oxide) substituted with a (e.g., 1, 2, or 3) C6 to C22 alkyl group(s), a C12 to C22 aromatic ether such as a phenyl ether or a benzyl ether, or a combination thereof.

The organic ligand may coordinate, e.g., be bound to, the surface of the produced nanocrystal and may have an effect on the light emitting and electric characteristics as well as may effectively disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, $R_2POOH$, or a combination thereof, wherein each R is the same or different and is each independently hydrogen, a substituted or unsubstituted C1 to C40 (or C3 to C24) aliphatic hydrocarbon group, a substituted or unsubstituted C6 to C40 (or C6 to C24) aromatic hydrocarbon group, or a combination thereof provided that an, e.g., at least one, R is not hydrogen. One or more ligands may be used.

Examples of the organic ligand compound may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; a phosphine such as methyl phosphine, ethyl phosphine, propyl phosphine, butyl phosphine, pentyl phosphine, tributylphosphine, or trioctylphosphine; a phosphine oxide such as methyl phosphine oxide, ethyl phosphine oxide, propyl phosphine oxide, butyl phosphine oxide, or trioctylphosphine oxide; a diphenyl phosphine or an oxide compound thereof; a triphenyl phosphine or an oxide compound thereof; phosphonic acid, or the like, but are not limited thereto. One or more organic ligand compounds may be used. In an embodiment, the organic ligand compound may be a combination of RCOOH and amine, e.g., $RNH_2$, $R_2NH$, $R_3N$, or a combination thereof, wherein R is as defined herein.

The reaction temperature for the formation of the first semiconductor nanocrystal or the core may be in a range of about 280° C. to about 340° C., about 290° C. to about 330° C., or about 300° C. to about 320° C., or a combination thereof. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

Reaction conditions (e.g., reaction temperature, reaction time, or the like) for forming the shell may be selected appropriately taking into consideration a desired composition of the shell. In an embodiment, a solvent and optionally an organic ligand may be heated, placed under vacuum, e.g., subjected to vacuum conditions, or a combination thereof at a predetermined temperature (e.g., at a temperature of greater than or equal to about 100° C.). After a predetermined time under vacuum, the reaction vessel is charged (filled) with an inert gas and then is heated at a predetermined temperature (e.g., at a temperature of greater than or equal to about 100° C.). Then, a first semiconductor nanocrystal (or a core) may be added, e.g., injected, and shell precursors may be added, e.g., injected sequentially or simultaneously and a resulting mixture is heated to a predetermined reaction temperature to carry out a desired reaction.

A mixture having different ratios of the shell precursors may be sequentially added for a given period of time, e.g., a reaction time, to achieve a desired composition of the quantum dot or to form a gradient or a multi-layered shell on the core. In an embodiment, a first shell layer may be formed by reacting a zinc precursor and a selenium precursor and then a second shell layer may be formed by reacting a zinc precursor and a sulfur precursor. A reaction temperature for forming the first or the second shell layer may be greater than or equal to about 320° C., greater than or equal to about 330° C., or greater than or equal to about 340° C. A reaction temperature for forming the first or the second shell layer may be less than or equal to about 380° C., less than or equal to about 370° C., less than or equal to about 360° C., or less than or equal to about 350° C.

In a reaction system, an amount and a concentration of the precursors may be selected considering the compositions of the core and the shell layers and the reactivity between the precursors, provided that in the reaction for the formation of the ZnS shell, a mole ratio of sulfur (or a sulfur precursor) to zinc (a zinc precursor) being provided to a reaction system (hereinafter, a S:Zn mole ratio) is controlled at greater than or equal to about 2.4:1.

The S:Zn mole ratio may be in a range of about 2.4:1 to about 10:1, of about 2.5:1 to about 9:1, of about 2.6:1 to about 8:1, of about 2.7:1 to about 7:1, of about 2.8:1 to about 6:1, of about 2.9:1 to about 5:1, of about 3:1 to about 4.5:1, or a combination thereof. Without wishing to be bound by any theory, controlling the S:Zn mole ratio within the aforementioned ratio may have a substantial effect on a shell coating rate (or control the same at a desired rate), whereby growing a shell only in a certain crystal direction may be suppressed effectively, growing a shell uniformly and for example substantially in all direction may be facilitated, or a combination thereof. Accordingly, the semiconductor nanoparticles thus prepared or a population including the same may exhibit a relatively high level of circularity, e.g., large average circularity, or sphericity for example as a whole. In addition, as determined in an energy dispersive spectroscopy (EDS), an electron energy loss spectroscopy analysis (EELS), or a combination thereof, the nanoparticles thus prepared may have a relatively uniform coating.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation reaction, shell formation reaction, or a combination thereof and may not be capable of dispersing the produced nanocrystals therein. The non-solvent may be selected depending on the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing solvent and washed, if desired. The washing solvent is not particularly limited and a solvent having similar solubility parameter to that of the ligand may be used and examples thereof may include hexane, heptane, octane, chloroform, toluene, benzene, or the like.

The semiconductor nanoparticles of an embodiment may not be dispersible in water, any of the foregoing listed non-solvents, or a mixture, e.g., combination, thereof. The semiconductor nanoparticles of an embodiment may be water-insoluble.

The semiconductor nanoparticles of an embodiment following separation from the reaction solvent and reaction components may be dispersed in an aforementioned organic solvent. In an embodiment, the semiconductor nanoparticles may be dispersed in a C6 to C40 aliphatic hydrocarbon, a C6 to C40 aromatic hydrocarbon, or a mixture, e.g., combination, thereof.

In an electroluminescent device of an embodiment, a thickness of the light emitting layer may be selected appropriately.

In an embodiment, the light emitting layer 3 or 30 may include a monolayer of semiconductor nanoparticles. In an embodiment, the light emitting layer 3 or 30 may include a monolayer of semiconductor nanoparticles, e.g., one or more, two or more, three or more, or four or more and 20 or less, 10 or less, 9 or less, 8 or less, 7 or less, or 6 or less, monolayers of semiconductor nanoparticles. The light emitting layer 30 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 30 may have a thickness of, for example, about 10 nm to about 150 nm, about 20 nm to about 100 nm, or about 30 nm to about 50 nm.

The forming of the light emitting layer may be performed by preparing a composition including nanostructures (configured to emit desired light) and applying or depositing the composition on a substrate for example including an electrode or a charge auxiliary layer in, e.g., by, an appropriate method (e.g., spin coating, inkjet printing, and the like).

The electroluminescent device may further include a charge (hole or electron) auxiliary layer between the first electrode and the second electrode (e.g., an anode and a cathode). In an embodiment, the electroluminescent device may include a hole auxiliary layer 20 or an electron auxiliary layer 40 between the anode 10 and the light emitting layer 30, between the cathode 50 and the light emitting layer 30, or a combination thereof. See, FIGS. 2 and 3

The light emitting device according to an embodiment may further include a hole auxiliary layer. The hole auxiliary layer 20 may be disposed between the first electrode 10 and the light emitting layer 30. The hole auxiliary layer 20 may include a hole injection layer, a hole transport layer, an electron blocking layer, or a combination thereof. The hole auxiliary layer 20 may be a layer of a single component or a multilayer structure in which adjacent layers include different components.

The HOMO energy level of the hole auxiliary layer 20 may have a HOMO energy level that can be matched with the HOMO energy level of the light emitting layer 30 in order to enhance mobility of holes transferred from the hole auxiliary layer 20 to the light emitting layer 30. In an embodiment, the hole auxiliary layer 20 may include a hole injection layer close to the first electrode 10 and a hole transport layer close to the light emitting layer 30.

The material included in the hole auxiliary layer 20 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinyl-carbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4,4'-bis[N-(1-naphthyl)-N-phenyl-amino]biphenyl (α-NPD), m-MTDATA (4,4',4"-Tris[phenyl(m-tolyl)amino]triphenylamine), 4,4', 4"-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 40 is disposed between the light emitting layer 30 and the second electrode 50. The electron auxiliary layer 40 may include, for example, an electron injection layer, an electron transport layer, a hole blocking layer, or a combination thereof. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the cathode. For example, the hole blocking layer may be disposed between the light emitting layer and the electron transport (injection) layer but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL), the electron injection layer, the hole blocking layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF tris(8-hydroxyquinoline)aluminum ($Alq_3$), tris(8-hydroxyquinoline)gallium ($Gaq_3$), tris-(8-hydroxyquinoline)indium ($Inq_3$), bis(8-hydroxyquinoline)zinc ($Znq_2$), bis(2-(2-hydroxyphenyl)benzothiazolate)zinc ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.) or a combination thereof, but is not limited thereto.

The electron auxiliary layer 40 may include an electron transport layer. The electron transport layer may include a plurality of nanoparticles. The plurality of nanoparticles may include a metal oxide containing zinc.

The metal oxide may include zinc oxide, zinc magnesium oxide, or a combination thereof. The metal oxide may include $Zn_{1-x}M_xO$, wherein M is Mg, Ca, Zr, W, Li, Ti, Y, Al, or a combination thereof and $0 \leq x \leq 0.5$. In an embodiment, the M in the formula $Zn_{1-x}M_xO$ may be magnesium (Mg). In an embodiment, in the formula $Zn_{1-x}M_xO$, the x may be greater than or equal to about 0.01 and less than or equal to about 0.3, for example, less than or equal to about 0.25, less than or equal to about 0.2, or less than or equal to about 0.15.

The absolute value of the LUMO of the aforementioned nanostructures included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 40 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, such as Mg, Al, etc.). The hole auxiliary layer 20 (e.g., a hole injection layer such as PEDOT:PSS, p-type metal oxide, or a combination thereof; a hole transport layer such as TFB, PVK, or a combination thereof; or a combination thereof) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50. (Refer to FIG. 2)

A device according to an embodiment may have an inverted structure. Herein, the cathode 50 disposed on the transparent substrate 100 may include a metal oxide-based transparent electrode (e.g., ITO), and the anode 10 facing the cathode may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB, PVK, or a combination thereof; a hole injection layer including $MoO_3$ or other p-type metal oxide; or a combination thereof) between the metal anode 10 and the light emitting layer 30. See, FIG. 3.

The aforementioned device may be manufactured by an appropriate method. For example, the electroluminescent device may be manufactured by optionally forming a hole auxiliary layer (e.g., by deposition or coating) on a substrate on which an electrode is disposed, forming a light emitting layer including nanostructures (e.g., a pattern of the aforementioned nanostructures), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

The electroluminescent device of an embodiment may be configured to emit red light, blue light, or green light. A wavelength range of the red light, blue light, or green light may be the same as described herein.

In the electroluminescent device of an embodiment, a maximum external quantum efficiency (EQE) may be greater than or equal to about 4%, greater than or equal to about 5%, greater than or equal to about 6%, greater than or equal to about 7%, greater than or equal to about 7.5%, greater than or equal to about 8%, greater than or equal to about 8.5%, greater than or equal to about 9%, greater than or equal to about 9.5%, or greater than or equal to about 10%. In the electroluminescent device of an embodiment, a maximum external quantum efficiency (EQE) may be less than or equal to about 40%, less than or equal to about 30%, or less than or equal to about 20%.

In an embodiment, the light emitting device may exhibit an improved life-span. In an embodiment, as measured by driving the device at a predetermined luminance (for example, about 100 nit (candelas per square meter) to about 3,000 nit, about 200 nit to about 2800 nit, about 400 nit to about 2,600 nit, about 600 nit to about 2,500 nit, about 650 nit to about 2,000 nit, or a combination thereof) the light emitting device may have a T50 of greater than or equal to about 17 hours.

In an embodiment, the T50 may be greater than or equal to about 20 hours, greater than or equal to about 25 hours, greater than or equal to about 30 hours, greater than or equal to about 35 hours, greater than or equal to about 40 hours, or greater than or equal to about 45 hours. In an embodiment, the light emitting device may have a T50 of less than or equal to about 2,000 hours, less than or equal to about 1,500 hours, less than or equal to about 1,000 hours, less than or equal to about 500 hours, less than or equal to about 300 hours, or less than or equal to about 100 hours.

In an embodiment, the electroluminescent device may have a maximum luminance of greater than or equal to about 10,000 candelas per square meter ($cd/m^2$) (hereinafter, nit), greater than or equal to about 50,000 nit, greater than or equal to about 70,000 nit, greater than or equal to about 90,000 nit, or greater than or equal to about 100,000 nit and less than or equal to about 500,000 nit, less than or equal to about 400,000 nit, less than or equal to about 300,000 nit, less than or equal to about 250,000 nit or less than or equal to about 200,000 nit. The maximum luminance may be greater than or equal to about 39000 $cd/m^2$ (or 39256 $cd/m^2$) or greater than or equal to about 57000 $cd/m^2$ (or 57456 $cd/m^2$).

In an embodiment, a display device including the electroluminescent device described herein.

The display device may include a first pixel and a second pixel that is configured to emit light different from the first pixel. The first pixel, the second pixel, or a combination thereof may include the electroluminescent device of an embodiment.

The display device or an electronic device may include (or may be) a handheld terminal, a monitor, a notebook computer, a television, an electronic display board, a camera, or a part for, e.g., of, an automatic, e.g., autonomous, vehicle.

Specific examples are described below. However, the examples described below are only for specifically illustrating or explaining the disclosure, and the scope of the disclosure is not limited thereto.

EXAMPLES

1. Photoluminescence Analysis and Absolute Quantum Yield (QY) Measurement

Photoluminescence (PL) spectra of the nanoparticles are measured at room temperature using a Hitachi F-7000 spectrophotometer or a Quantaurus-QY measurement equipment (Quantaurus-QY Absolute PL quantum yield spectrophotometer C11347-11) from Hamamatsu Co., Ltd, with an irradiation wavelength of 400 nanometers (nm).

2. Transmission Electron Microscopy (TEM) Energy-Dispersive X-Ray (EDX)/Electron Energy Loss Spectroscopy (EELS) Analysis Using an UT F30 Tecnai electron microscope, a TEM analysis and an EELS analysis are carried out. From the obtained TEM images, a shape factor of the particles is measured (smoothing 2 times)

3. Inductively Coupled Plasma (ICP) Analysis

An inductively coupled plasma-atomic emission spectroscopy (ICP-AES) analysis is performed using Shimadzu ICPS-8100.

4. Electroluminescence Spectroscopic Analysis

A current according to an applied voltage is measured with a Keithley 2635B source meter, and a CS2000 spectrometer is used to measure electroluminescent properties (e.g., luminance (Lum.)) of a light-emitting device.

5. Life-Span Characteristics

T50(h): A device is driven at a predetermined brightness (e.g., 650 nit (candelas per square meter)), and the time (hours (hr)) for the brightness to decrease to 50% of the initial brightness (100%) is determined.

The following synthesis is performed under an inert gas atmosphere (e.g., under nitrogen) unless otherwise specified. A precursor content is provided as a molar content, unless otherwise specified.

Example 1

A 2 molar (moles per liter (M)) Se/trioctylphosphine (TOP) stock solution, a 1 M S/TOP stock solution, and a 0.1 M Te/TOP stock solution are prepared by dispersing selenium (Se), sulfur(S), and tellurium (Te) in trioctylphosphine (TOP), respectively.

In a 300 milliliter (mL) reactor containing trioctylamine, 4.5 millimoles (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1/20 are rapidly injected into the reactor. When the reaction is complete, the reaction solution is rapidly cooled to room temperature and ethanol is added to the reactor. The reaction product mixture is centrifuged and the formed precipitate is separated and dispersed in toluene to obtain a ZnSeTe core. An average size of the cores is about 3 nm.

A predetermined amount of zinc acetate and oleic acid are added to a flask containing trioctylamine and the obtained mixture is heated at 120° C. under vacuum for 10 minutes. Nitrogen ($N_2$) is then introduced into the reactor, and during the time when the mixture is heated to 340° C., a hexane dispersion of the obtained ZnTeSe cores is added quickly and a Se/TOP stock solution is then added thereto to carry out a reaction between the zinc precursor and the selenium precursor. Then, to the reactor, the zinc precursor and the sulfur stock solution is added with a S:Zn mole ratio as shown in Table 1. A total reaction time is about 180 minutes.

When the reaction is complete, the reactor is cooled to room temperature and is added with ethanol to facilitate precipitation of the nanoparticles, which are separated by centrifuge to recover. Then, the obtained nanoparticles are dispersed in octane.

For the nanoparticles thus obtained, a photoluminescent spectroscopy analysis is carried out and the results are shown in Table 1.

For the nanoparticles thus obtained, a TEM analysis, and an ICP-AES analysis are carried out and the results are shown in Table 2.

Example 2

The semiconductor nanoparticles are prepared in the same manner as Example 1 except for changing the S:Zn mole ratio into Table 1.

For the nanoparticles thus obtained, a photoluminescent spectroscopy analysis is carried out and the results are shown in Table 1.

For the nanoparticles thus obtained, a TEM analysis and an ICP-AES analysis are carried out and the results are shown in Table 2.

Example 3

The semiconductor nanoparticles are prepared in the same manner as Example 1 except for changing the S:Zn mole ratio into Table 1.

For the nanoparticles thus obtained, a photoluminescent spectroscopy analysis is carried out and the results are shown in Table 1.

For the nanoparticles thus obtained, a TEM analysis and an ICP-AES analysis are carried out and the results are shown in Table 2.

Example 4

The semiconductor nanoparticles are prepared in the same manner as Example 1 except for changing the S:Zn mole ratio into Table 1.

For the nanoparticles thus obtained, a photoluminescent spectroscopy analysis is carried out and the results are shown in Table 1.

For the nanoparticles thus obtained, a TEM analysis, a TEM-EELS analysis, and an ICP-AES analysis are carried out and the results are shown in Table 2 and FIG. 4A and FIG. 4B. In FIG. 4B, a shell including sulfur is shown.

Example 5

The semiconductor nanoparticles are prepared in the same manner as Example 1 except for changing the S;Zn mole ratio into Table 1.

For the nanoparticles thus obtained, a photoluminescent spectroscopy analysis is carried out and the results are shown in Table 1.

For the nanoparticles thus obtained, a TEM analysis and an ICP-AES analysis are carried out and the results are shown in Table 2.

Comparative Example 1

The semiconductor nanoparticles are prepared in the same manner as Example 1 except for changing the S:Zn mole ratio into Table 1.

For the nanoparticles thus obtained, a photoluminescent spectroscopy analysis is carried out and the results are shown in Table 1.

For the nanoparticles thus obtained, a TEM analysis, a TEM-EELS analysis, and an ICP-AES analysis are carried out and the results are shown in Table 2 and FIG. 5A and FIG. 5B.

TABLE 1

|  | Mole ratio of S:Zn | PL peak wavelength (nm) |
|---|---|---|
| Comparative Example 1 | 0.9:1 | 454 |
| Example 1 | 2.9:1 | 456 |
| Example 2 | 3.8:1 | 450 |
| Example 3 | 4.5:1 | 452 |
| Example 4 | 5.5:1 | 451 |
| Example 5 | 6.4:1 | 451 |

TABLE 2

| | Average (Avg.) size of the particles (nm) | Std. of particle size distribution (based on Avg. size) | Circularity (Std) | Mole ratio of Zn:(Se + S) | Mole ratio of (Se + S):Zn |
|---|---|---|---|---|---|
| Comparative Example 1 | 11.5 | 10% | 0.75 ± 0.05 (6%) | 1.16:1 | 0.86:1 |
| Example 1 | 10.7 | 6% | 0.83 ± 0.02 (3%) | 1.09:1 | 0.91:1 |
| Example 2 | 10.6 | 5% | 0.85 ± 0.02 (2%) | 1.07:1 | 0.93:1 |
| Example 3 | 10.5 | 8% | 0.86 ± 0.02 (2%) | 1.06:1 | 0.95:1 |
| Example 4 | 10.7 | 7% | 0.87 ± 0.01 (2%) | 1.05:1 | 0.95:1 |
| Example 5 | 10.4 | 7% | 0.87 (2%) | 1.09:1 | 0.92:1 |

Std: Standard Deviation

From the results of Table 2, FIG. 4A, FIG. 4B, FIG. 5A, and FIG. 5B, the semiconductor nanoparticles of the Examples exhibited improved (or far greater) average value of circularity in comparison with the Comparative Example, and had a very uniform shell coating.

Experimental Example 1

Thermal Stability of Film

The semiconductor nanoparticles of Example 1 and the semiconductor nanoparticles of Comparative Example 1 are dispersed in octane respectively, and on a quartz substrate, each of the obtained dispersion is applied to obtain a thin film of the nanoparticles, which is then heat-treated at 80° C. for 30 minutes. A quantum efficiency of the thin film prior to and after the heat treatment is measured, respectively, and the maintenance value is evaluated and the results are shown in Table 3.

TABLE 3

| Coating | QY of thin film | QY of thin film after a thermal treatment at 80° C. | Maintenance value |
|---|---|---|---|
| Comparative Example 1 | 75% | 58% | 77% |
| Example 1 | 82% | 75% | 91% |

QY: Quantum Yield

The results of Table 3 confirmed that the thin film including the semiconductor nanoparticles of Example 1 showed, e.g., exhibited, a higher QY and a significantly improved maintenance value than those of the thin film including the semiconductor nanoparticles of Comparative Example 1.

Experimental Example 2

Electron Doping Experiment for the Semiconductor Nanoparticles in a Solution State The semiconductor nanoparticles of Example 1 and the semiconductor nanoparticles of Comparative Example 1 are dispersed in hexane respectively, to obtain solutions. For each of the solutions, lithium triethylborohydride (LiEt3BH) 0.004 mmol (1.3 millimolar (mM)) is added as a reducing agent and a photoluminescence of the semiconductor nanoparticles in the solution is measured prior to and after the addition of the reducing agent.

The results confirmed that the semiconductor nanoparticles of Comparative Example 1 showed, e.g., exhibited, a decrease of PL below, e.g., to less than, 20% of the initial value, but the semiconductor nanoparticles of Example 1 maintained PL at greater than or equal to about 40% of the initial value.

The results indicated that the semiconductor nanoparticles are more stable for a chemical charging.

Preparation of Electroluminescent Device

Example 6

The light-emitting device is fabricated using the light emitting nanostructures of preparation Example 1 according to the following method.

On an indium tin oxide (ITO) (anode)-deposited glass substrate, a poly(3,4-ethylenedioxythiophene)polystyrene sulfonate (PEDOT:PSS) solution (H. C. Starks) and poly [(9,9-dioctylfluorene'co-(4,4'-(N-4-butylphenyl)diphe-nylamine] solution (TFB) (Sumitomo) are spin-coated and then heat-treated as a hole injecting layer (HIL) and a hole transporting layer (HTL) with a thickness of 30 nm and a thickness of 25 nm, respectively. The nanostructures obtained from Preparation Example 1 are dispersed in octane and is spin-coated on the HTL and heat-treated to provide a light emitting film with a thickness of 25 nm, On the light-emitting film is formed an electron trans-porting layer (ETL) including zinc oxide nanoparticles hav-ing a thickness of about 40 nm, and then an aluminum (Al) is vacuum-deposited on the ETL to provide a second elec-trically conducting layer. The electroluminescent properties of the obtained device are evaluated, and the results are shown in Table 3.

Comparative Example 2

Except for using the semiconductor nanoparticles, an electroluminescent device is prepared in the same manner as in Example 6. The electroluminescent properties of the obtained device are evaluated, and the results are shown in Table 3.

TABLE 3

| | Efficiency | | | |
|---|---|---|---|---|
| Description | Maximum (Max.) external quantum efficiency EQE (%) | Max. Lum. (cd/m$^2$) | V @ 5 milliamperes (mA) (volts) | Lifetime T50 @ 650 nit (hours) |
| Comparative Example 2 | 7.3 | 39256 | 3.1 | 16.9 |
| Example 6 | 10.5 | 57456 | 3.0 | 30 |

While this disclosure has been described in connection with what is presently considered to be practical embodi-ments, it is to be understood that the invention is not limited to the disclosed embodiments. On the contrary, it is intended to cover various modifications and equivalent arrangements included within the spirit and scope of the appended claims.

US 12,628,494 B2

33

What is claimed is:

1. An electroluminescent device comprising
a first electrode;
a second electrode spaced apart from the first electrode; and
a light emitting layer disposed between the first electrode and the second electrode,
wherein the light emitting layer comprises semiconductor nanoparticles, wherein the semiconductor nanoparticles do not comprise cadmium,
wherein the semiconductor nanoparticles have a core shell structure and comprise zinc, selenium, tellurium, and sulfur,
wherein in a two dimensional image obtained by an electron microscopy analysis, an average circularity of the semiconductor nanoparticles is greater than 0.8 and less than or equal to about 1, a circularity being defined by the following formula:

$$\text{circularity} = 4\pi \times \frac{\text{Area}}{[\text{Perimeter}]^2}$$

wherein Area is an area of a two dimensional image of an individual semiconductor nanoparticle, and Perimeter is a circumference of the two dimensional image of the individual semiconductor nanoparticle.

2. The electroluminescent device of claim 1, wherein the electroluminescent device further comprises a hole auxiliary layer between the light emitting layer and the first electrode, wherein the electroluminescent device further comprises an electron auxiliary layer between the light emitting layer and the second electrode, or a combination thereof, and optionally wherein the hole auxiliary layer comprises an organic compound, the electron auxiliary layer comprises zinc magnesium metal oxide nanoparticles, or a combination thereof.

3. The electroluminescent device of claim 1, wherein an average size of the semiconductor nanoparticles is greater than or equal to about 5 nanometers and less than or equal to about 50 nanometers.

4. The electroluminescent device of claim 1, wherein the core shell structure comprises a core comprising a first semiconductor nanocrystal and a semiconductor nanocrystal shell disposed on the core,
wherein the first semiconductor nanocrystal comprises a first zinc chalcogenide comprising zinc, selenium, and tellurium, and
wherein the semiconductor nanocrystal shell comprises a second zinc chalcogenide comprising zinc and sulfur and optionally a third zinc chalcogenide comprising zinc and selenium.

5. The electroluminescent device of claim 4, wherein as determined by a transmissive electron microscopy analysis of the semiconductor nanoparticles, a thickness variance of the semiconductor nanocrystal shell determined by the following equation is less than or equal to about 0.3:

$$\text{thickness variance}=(T_{max}-T_{min})/(T_{max})$$

wherein
$T_{max}$ is a maximum thickness of the semiconductor nanocrystal shell in a given semiconductor nanoparticle, and
$T_{min}$ is a minimum thickness of the semiconductor nanocrystal shell in a given semiconductor nanoparticle.

6. The electroluminescent device of claim 1, wherein in the semiconductor nanoparticles, a mole ratio of tellurium to selenium is greater than 0:1 and less than or equal to about 0.1:1;
or
wherein in the semiconductor nanoparticles, a mole ratio of a sum of sulfur and selenium to zinc is greater than or equal to about 0.88:1 and less than or equal to about 3:1.

7. The electroluminescent device of claim 1, wherein the average circularity of the semiconductor nanoparticles is greater than 0.81.

8. The electroluminescent device of claim 1, wherein the semiconductor nanoparticles do not comprise an indium phosphide, a gallium phosphide, manganese, copper, or a combination thereof.

9. The electroluminescent device of claim 1, wherein the light emitting layer is configured to emit light with a quantum yield or quantum efficiency of greater than 75% when irradiated with light, and the light emitting layer has a quantum yield maintenance value of greater than or equal to about 80%, after a 30 minute heat treatment at about 80° C.

10. The electroluminescent device of claim 1, wherein the light emitting layer is configured to emit blue light having a maximum luminescent peak wavelength of greater than or equal to about 400 nanometers and less than or equal to about 500 nanometers when a voltage is applied between the first electrode and the second electrode,
and wherein the electroluminescent device has a maximum external quantum efficiency of greater than or equal to about 7.5% and less than or equal to about 40%, a maximum luminance of greater than or equal to about 10,000 candelas per square meter and less than or equal to about 200,000 candelas per square meter, or a combination thereof.

11. Semiconductor nanoparticles, wherein the semiconductor nanoparticles comprise zinc, selenium, tellurium, and sulfur and do not comprise cadmium,
wherein the semiconductor nanoparticles are configured to emit blue light,
wherein in a two dimensional image obtained by an electron microscopy analysis, the semiconductor nanoparticles show an average value of a circularity defined by the following equation of greater than 0.8 and less than or equal to about 1:

$$\text{circularity} = 4\pi \times \frac{\text{Area}}{[\text{Perimeter}]^2}$$

wherein Area is an area of a two dimensional image of an individual semiconductor nanoparticle, and Perimeter is a circumference of the two dimensional image of the individual semiconductor nanoparticle.

12. The semiconductor nanoparticles of claim 11, wherein an average particle size of the semiconductor nanoparticles is greater than or equal to about 9 nanometers and less than or equal to about 12 nanometers and a standard deviation of sizes of the semiconductor nanoparticles is greater than or equal to about 3% and less than or equal to about 15% of the average particle size; or
wherein the semiconductor nanoparticles do not comprise an indium phosphide, a gallium phosphide, manganese, copper, or a combination thereof.

13. The semiconductor nanoparticles of claim 11, wherein the semiconductor nanoparticles comprise a core comprising a first semiconductor nanocrystal and a semiconductor nanocrystal shell disposed on the core, wherein the first semiconductor nanocrystal comprises a first zinc chalcogenide comprising zinc, selenium, and tellurium, and wherein the semiconductor nanocrystal shell comprises a second zinc chalcogenide comprising zinc and sulfur and optionally a third zinc chalcogenide comprising zinc and selenium.

14. The semiconductor nanoparticles of claim 13, wherein as determined by a transmissive electron microscopy analysis of the semiconductor nanoparticles, a thickness variance of the semiconductor nanocrystal shell determined by the following equation is less than or equal to about 0.3:

$$\text{thickness variance} = (T_{max} - T_{min})/(T_{max})$$

wherein $T_{max}$ is a maximum thickness of the semiconductor nanocrystal shell in a given semiconductor nanoparticle, and $T_{min}$ is a minimum thickness of the semiconductor nanocrystal shell in a given semiconductor nanoparticle.

15. The semiconductor nanoparticles of claim 11, wherein the semiconductor nanoparticles comprise a mole ratio of tellurium to selenium of greater than 0:1 and less than or equal to about 0.1:1 or a mole ratio of a sum of selenium and sulfur to zinc of greater than or equal to about 0.88:1 and less than or equal to about 3:1.

16. The semiconductor nanoparticles of claim 11, wherein the average circularity of the semiconductor nanoparticles is greater than 0.81.

17. A method of producing the semiconductor nanoparticles of claim 11, which comprises:

conducting a reaction between a zinc precursor and a sulfur precursor in the presence of a particle comprising a first semiconductor nanocrystal comprising zinc, selenium, and tellurium to form a semiconductor nanocrystal shell comprising zinc and sulfur to produce the semiconductor particles, wherein in the reaction, a mole ratio of the sulfur precursor to the zinc precursor is greater than or equal to about 2.4:1.

18. A display device comprising the semiconductor nanoparticles of claim 11.

19. The display device of claim 18, wherein the display device comprises a handheld terminal, a monitor, a notebook computer, a television, an electronic display board, a camera, or a part of an autonomous vehicle.

20. Semiconductor nanoparticles comprising:

a core comprising a first semiconductor nanocrystal comprising a first zinc chalcogenide comprising zinc, selenium, and tellurium; and a shell disposed on the core, the shell comprising a second semiconductor nanocrystal comprising a second zinc chalcogenide comprising zinc and sulfur and optionally a third zinc chalcogenide comprising zinc and selenium, wherein the semiconductor nanoparticles are configured to emit blue light having a maximum luminescent peak wavelength of greater than or equal to about 430 nanometers and less than or equal to about 480 nanometers, and as determined by a transmissive electron microscopy analysis of the semiconductor nanoparticles, a thickness variance of the semiconductor nanocrystal shell determined by the following equation is less than or equal to about 0.3:

$$\text{thickness variance} = (T_{max} - T_{min})/(T_{max})$$

wherein $T_{max}$ is a maximum thickness of the semiconductor nanocrystal shell in a given semiconductor nanoparticle, and $T_{min}$ is a minimum thickness of the semiconductor nanocrystal shell in a given semiconductor nanoparticle.

* * * * *